United States Patent
Carr

(10) Patent No.: US 7,371,992 B2
(45) Date of Patent: May 13, 2008

(54) METHOD FOR NON-CONTACT CLEANING OF A SURFACE

(75) Inventor: Jeffrey W. Carr, Livermore, CA (US)

(73) Assignee: RAPT Industries, Inc., Fremont, CA (US)

( * ) Notice: Subject to any disclaimer, the term of this patent is extended or adjusted under 35 U.S.C. 154(b) by 0 days.

(21) Appl. No.: 10/384,506

(22) Filed: Mar. 7, 2003

(65) Prior Publication Data

US 2004/0173579 A1    Sep. 9, 2004

(51) Int. Cl.
*B23K 10/06* (2006.01)
(52) U.S. Cl. .......................... 219/121.44; 219/121.59; 219/121.4
(58) Field of Classification Search ............. 219/121.4, 219/121.41, 121.43, 121.42, 121.59; 118/723 R, 118/723 I, 723 MW, 723 AN; 156/643.1, 156/345.54, 345.55, 646.1, 345.39, 345.47; 204/298.2–298.37; 313/231.31, 231.71; 315/111.51, 111.71, 111.81; 438/710, 720, 438/115, 906, 112–126

See application file for complete search history.

(56) References Cited

U.S. PATENT DOCUMENTS

| | | | |
|---|---|---|---|
| 3,937,866 A * | 2/1976 | Sunnen et al. ................ 373/20 |
| 3,953,704 A * | 4/1976 | Bejat et al. ............... 219/76.16 |
| 4,050,408 A | 9/1977 | Beucherie |
| 4,306,175 A | 12/1981 | Schleicher et al. |
| 4,339,326 A | 7/1982 | Hirose et al. |
| 4,431,898 A | 2/1984 | Reinberg et al. |
| 4,431,901 A | 2/1984 | Hull |
| 4,532,199 A | 7/1985 | Ueno ......................... 430/128 |
| 4,689,467 A | 8/1987 | Inoue |
| 4,908,492 A | 3/1990 | Okamoto et al. |
| 4,924,061 A | 5/1990 | Labat et al. |
| 5,106,827 A | 4/1992 | Borden et al. |
| 5,200,595 A | 4/1993 | Boulos et al. |

(Continued)

FOREIGN PATENT DOCUMENTS

DE    199 25 790 A1    7/2000

(Continued)

OTHER PUBLICATIONS

International Search Report Mailed Oct. 31, 2005.

(Continued)

*Primary Examiner*—Mark Paschall
(74) *Attorney, Agent, or Firm*—Fliesler Meyer LLP

(57) ABSTRACT

A flame torch can be used to clean the surface of a contact-sensitive object, such as a glass optic, extremely thin workpiece, or semiconductor wafer by providing a reactive precursor gas to the feed gases of the torch. Reactive atom plasma processing can be used to clean the surface of a contaminant that chemically combines with the atomic radicals of the precursor without affecting the surface. The torch can also be used to modify the surface after cleaning, without transferring the object or engaging in any intermediate processing, by supplying a second reactive precursor that reacts with the surface itself. The flame torch can be used to shape, polish, etch, planarize, deposit, chemically modify and/or redistribute material on the surface of the object.

This description is not intended to be a complete description of, or limit the scope of, the invention. Other features, aspects, and objects of the invention can be obtained from a review of the specification, the figures, and the claims.

33 Claims, 4 Drawing Sheets

U.S. PATENT DOCUMENTS

| | | | |
|---|---|---|---|
| 5,238,532 A | 8/1993 | Zarowin et al. | |
| 5,254,830 A | 10/1993 | Zarowin et al. | |
| 5,256,205 A | 10/1993 | Schmitt, III | |
| 5,280,154 A | 1/1994 | Cuomo et al. | |
| 5,290,382 A | 3/1994 | Zarowin et al. | |
| 5,291,415 A | 3/1994 | Zarowin et al. | |
| 5,292,400 A | 3/1994 | Mumola | |
| 5,298,103 A | 3/1994 | Steinberg et al. | |
| 5,321,224 A | 6/1994 | Kamimura et al. | |
| 5,336,355 A | 8/1994 | Zarowin et al. | |
| 5,344,524 A | 9/1994 | Sharma et al. | |
| 5,346,578 A | 9/1994 | Benzing et al. | |
| 5,349,154 A | 9/1994 | Harker et al. | |
| 5,364,496 A | 11/1994 | Bollinger et al. | |
| 5,372,674 A | 12/1994 | Steinberg | |
| 5,375,064 A | 12/1994 | Bollinger | |
| 5,376,224 A | 12/1994 | Zarowin | |
| 5,386,119 A | 1/1995 | Ledger | |
| 5,405,480 A | 4/1995 | Benzing et al. | |
| 5,419,803 A | 5/1995 | Mumola | |
| 5,429,730 A | 7/1995 | Nakamura et al. | |
| 5,430,355 A | 7/1995 | Paranjpe | |
| 5,474,642 A | 12/1995 | Zorina et al. | |
| 5,503,677 A | 4/1996 | Morsen et al. | |
| 5,563,709 A | 10/1996 | Poultney | |
| 5,591,068 A | 1/1997 | Taylor | |
| 5,639,699 A | 6/1997 | Nakamura et al. | |
| 5,650,032 A | 7/1997 | Keller et al. | |
| 5,676,863 A | 10/1997 | Jouvenel et al. | |
| 5,680,382 A | 10/1997 | Inoue | |
| 5,683,548 A | 11/1997 | Hartig | |
| 5,688,415 A | 11/1997 | Bollinger et al. | |
| 5,767,627 A | 6/1998 | Siniaguine | |
| 5,795,493 A | 8/1998 | Bukhman et al. | |
| 5,811,021 A | 9/1998 | Zarowin et al. | |
| 5,811,022 A | 9/1998 | Savas et al. | |
| 5,820,940 A * | 10/1998 | Gorynin et al. | 427/455 |
| 5,863,829 A | 1/1999 | Nakayoshi et al. | |
| 5,877,471 A | 3/1999 | Huhn et al. | |
| 5,897,712 A | 4/1999 | Hanawa et al. | |
| 5,942,445 A | 8/1999 | Kato et al. | |
| 5,944,902 A | 8/1999 | Redeker et al. | |
| 5,955,383 A | 9/1999 | Hwang | |
| 5,961,772 A | 10/1999 | Selwyn | |
| 5,965,034 A | 10/1999 | Vinogradov et al. | |
| 5,981,392 A | 11/1999 | Oishi | |
| 6,004,866 A | 12/1999 | Nakano et al. | |
| 6,017,221 A | 1/2000 | Flamm | |
| 6,028,286 A | 2/2000 | Wicker et al. | |
| 6,030,489 A | 2/2000 | Hwang | |
| 6,040,548 A | 3/2000 | Siniaguine | |
| 6,056,848 A | 5/2000 | Daviet | |
| 6,068,784 A | 5/2000 | Collins et al. | |
| 6,073,578 A | 6/2000 | Shim et al. | |
| 6,074,947 A | 6/2000 | Mumola | |
| 6,085,688 A | 7/2000 | Lymberopoulos et al. | |
| 6,093,655 A | 7/2000 | Donohoe et al. | |
| 6,105,534 A | 8/2000 | Siniaguine et al. | |
| 6,139,678 A | 10/2000 | Siniaguine | |
| 6,143,129 A | 11/2000 | Savas et al. | |
| 6,153,852 A | 11/2000 | Blutke et al. | |
| 6,170,428 B1 | 1/2001 | Redeker et al. | |
| 6,194,036 B1 | 2/2001 | Babayan et al. | |
| 6,200,908 B1 | 3/2001 | Vandamme et al. | |
| 6,203,661 B1 | 3/2001 | Siniaguine et al. | |
| 6,207,924 B1 * | 3/2001 | Trassy | 219/121.52 |
| 6,209,480 B1 | 4/2001 | Moslehi | |
| 6,214,161 B1 | 4/2001 | Becker et al. | |
| 6,218,640 B1 * | 4/2001 | Selitser | 219/121.52 |
| 6,221,268 B1 * | 4/2001 | Li et al. | 216/67 |
| 6,228,330 B1 | 5/2001 | Herrmann et al. | |
| 6,229,111 B1 | 5/2001 | McCay et al. | |
| 6,238,587 B1 | 5/2001 | Siniaguine et al. | |
| 6,239,004 B1 | 5/2001 | Aga et al. | |
| 6,239,553 B1 | 5/2001 | Barnes et al. | |
| 6,245,202 B1 | 6/2001 | Edamura et al. | |
| 6,262,523 B1 * | 7/2001 | Selwyn et al. | 313/231.31 |
| 6,388,225 B1 | 5/2002 | Blum et al. | |
| 6,406,590 B1 * | 6/2002 | Ebata et al. | 156/345 |
| 6,417,028 B2 * | 7/2002 | Wensel | 438/112 |
| 6,424,091 B1 * | 7/2002 | Sawada et al. | 315/111.81 |
| 6,482,476 B1 * | 11/2002 | Liu | 427/535 |
| 6,491,978 B1 * | 12/2002 | Kalanam | 427/569 |
| 6,551,860 B2 * | 4/2003 | Uner et al. | 438/115 |
| 6,660,177 B2 | 12/2003 | Carr | |
| 6,683,272 B2 | 1/2004 | Hammer | |
| 6,821,500 B2 * | 11/2004 | Fincke et al. | 423/650 |
| 2002/0058143 A1 * | 5/2002 | Hunt et al. | 428/412 |
| 2002/0177003 A1 * | 11/2002 | Myrick | 428/469 |
| 2003/0113479 A1 * | 6/2003 | Fukuda et al. | 427/569 |
| 2004/0115936 A1 * | 6/2004 | DePetrillo et al. | 438/689 |
| 2004/0118348 A1 | 6/2004 | Mills | |

FOREIGN PATENT DOCUMENTS

| | | |
|---|---|---|
| DE | WO 02/61171 A1 | 8/2002 |
| EP | 546 842 A1 | 6/1993 |
| JP | 50-153024 | 5/1974 |
| JP | 63-289798 | 11/1988 |
| JP | 09-115865 | 5/1997 |
| JP | 09-069397 | 11/1997 |
| JP | 10-298318 | 11/1998 |
| JP | 2000-173994 | 6/2000 |
| JP | 2000-174004 A | 6/2000 |
| JP | 2000-183044 | 6/2000 |
| JP | 2002-170815 | 6/2002 |
| WO | WO 02/062111 A2 | 8/2002 |

OTHER PUBLICATIONS

CB. Zarowin et al. "Rapid Non-Contact, damages free shaping of Optical & Other Surfaces with Plasma Assisted Chemical Etching, 43rd Annual Symposium on Frequency Control" 1989, pp. 623-626.

* cited by examiner

METHOD FOR NON-CONTACT CLEANING OF A SURFACE

FIELD OF INVENTION

The field of the invention relates to cleaning of surfaces using a flame and reactive gases.

BACKGROUND

Modern materials present a number of formidable challenges to the fabricators of a wide range of optical, semiconductor, and electronic components, many of which require precision shaping, smoothing, and polishing. Further, such a component often requires the cleaning of at least one surface before or after a step in the fabrication process. Other components simply require a fine cleaning separate from the fabrication process. Many current physical contact methods have the disadvantage of involving mechanical force at the microscopic scale that creates surface and possibly subsurface damage.

The basic designs and structure of a flame torch are well known, one of which contains a central tube that introduces a gas, liquid, or solid into the flame. This is the technology of flame photometry, a method by which a material can be chemically analyzed by injecting the material into a hot flame and analyzing the emission of light that results.

The use of plasma to chemically treat materials is also known. There are several known methods for using atmospheric plasmas to treat surfaces as such as rubber, plastic, and metals. The use of an oxygen plasma generated with an ICP to clean photoresist from the surface of a wafer has been described and claimed in U.S. Pat. No. 6,218,640. An ICP device can be quite complex, however, and comes with certain limitations. An ICP device can also be relatively expensive, and may not always be an optimal system for cleaning materials from a surface.

The use of an oxygen plasma to remove photoresist, a process called "ashing," is well established in the semiconductor community. Ashing is usually carried out in an reactive ion etch (RIE) chamber at reduced pressure. The need for a vacuum chamber increases cost and reduces throughput. Further, oxygen plasma processing with an RIE process can require a separate step to remove the "ash" from the wafer. RIE methods are not directional, and therefore cannot be used to simply clean a specific area of contamination from a wafer.

BRIEF SUMMARY

Systems and methods in accordance with embodiments of the present invention can overcome deficiencies and obstacles in the prior art to produce a highly-controllable, precise, atmospheric, non-contact surface cleaning process. These systems and methods also provide improved processes for cleaning and rapidly shaping hard-to-machine materials using a single or multiple flame torch.

Systems and methods in accordance with the present invention can clean the surface of a workpiece, such as a glass optic or semiconductor wafer, by supplying an appropriate reactive precursor gas to the flame of a flame torch. The flame torch is brought into proximity with the surface of the workpiece to be cleaned, or at least that portion of the surface to be cleaned. Reactive atom plasma processing can be used to clean contaminants from the surface of the workpiece by chemical reaction with the reactive species to form gas phase products that leave the surface. The precursor can be mixed with process gas for the flame, and the flame must be of a sufficient temperature to fragment the precursor into a stream of atomic radicals or molecular fragments that can react with the surface contaminant. Any contaminants on the surface that do not react with the atomic radicals remain unaffected. The surface of the workpiece is similarly unaffected.

Such systems and methods can also modify the surface of the workpiece after cleaning, without the need to transfer the workpiece to another device or engage in any intermediate processing. After the surface is sufficiently cleaned, a different reactive precursor can be introduced into the flame torch. This precursor can be selected to react with the surface itself in order to accomplish surface modification. The flame torch can then be used to shape, polish, etch, planarize, and/or deposit material on the surface of the workpiece. Other features, aspects, and objects of the invention can be obtained from a review of the specification, the figures, and the claims.

DETAILED DESCRIPTION

Figure 1A:
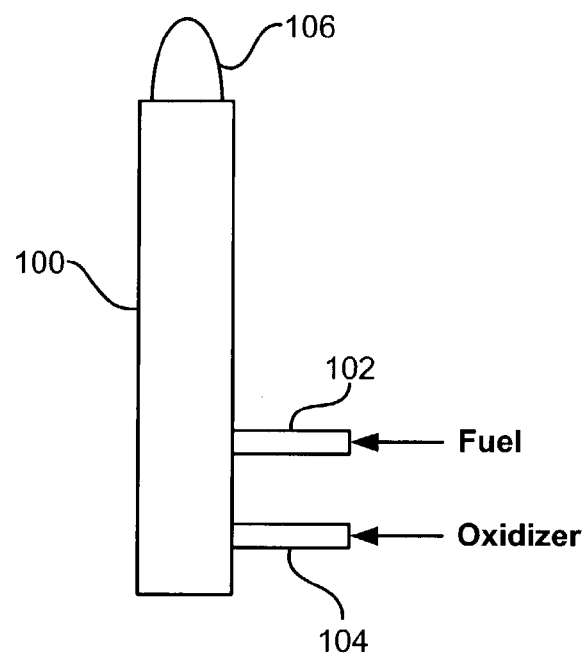
FIGS. 1(a) and 1(b) are diagrams of a torch that can be used in accordance with one embodiment of the present invention.

When developing systems useful for reactive atom plasma (RAP) processing, it was determined that certain parts needed to be cleaned before being processed. As used herein, "cleaning" refers to the selective removal of contaminants from a surface. A contaminant on the surface of a workpiece during an etch or surface modification process can act as a mask, causing the material below the contaminant to remain unaffected. This masking phenomenon can result in the formation of a plateau with the contaminant at the top. Alternately, the contaminant can act as a catalyst, causing the contaminant particles to burrow into the surface, with each particle potentially creating a pit in the surface. Either result is highly undesirable.

Initially, all the parts to be processed were cleaned manually in a class 100 clean room using wipes and solvents. While reasonably successful, the approach left behind a small number of particles, and, more problematically, a thin layer of organic material. This organic residue could not easily be removed with an $Ar/CF_4$ discharge. It was found that an oxygen plasma could be used to clean the surface of these parts, such as glass objects or semiconductor wafers, prior to experiments using a RAP process. Several experiments were carried out with wafers having an organic residue on the back edge.

One solution that was developed used an oxygen plasma treatment as a first step in the process. A mixture of 20% oxygen and 80% argon was introduced into the center of a 100% Ar plasma. The gas mixture simplified handling, as the material was not subject to the particular hazard control of 100% oxygen. Total treatment time for a six inch optic ranged from about 5 to about 30 minutes, with any time period in that range generating a similar result. The plasma was operated at 1000 watts with an Argon flow of 12 l/min and a reactive gas flow of 1 l/min. The part was moved rapidly under the discharge to minimize local heating. In the case of the wafer, the workpiece was quickly rotated without any translation since cleaning of the wafer edge was the objective. While oxygen plasmas are used in the semiconductor industry to remove photoresist and other organic materials on the surface of wafers, exposing a semiconductor device to an oxygen plasma can often cause damage to the device. Traditional plasma technology etches the entire wafer surface, not just the edge contamination as desired. The current invention uses a directional, deterministic plasma tool, which treats discreet areas of the surface and eliminates the need for a mask.

The efficiency of the cleaning process was evident in the parts that were later subjected to RAP processing. If exposed to the Ar/$CF_4$ plasma without cleaning, any fingerprints were etched permanently into the optic. Material removal was monitored with optical microscopy and, in the case of resist removal from wafer, by scraping the surface after cleaning.

A problem existed with the presence of a contaminant on the backside edge of silicon wafers. Experiments using oxygen plasmas generated with traditional plasma technology were attempted, but these experiments resulted in damage to the front side of the wafer. A RAP process using an ICP plasma containing oxygen was able to clean away the unwanted material from the wafer edge without damaging the front of the wafer.

With a later experiment, a different embodiment of a RAP process was attempted. Instead of using an ICP plasma, it was speculated that a simple hydrogen-oxygen ($H_2/O_2$) flame, adjusted to burn with an excess of oxygen, might be able to generate active oxygen fragments including oxygen radicals and ozone sufficient to clean the wafer edge as the ICP plasma had done. A device using such a simple flame would be cheaper, easier to develop and maintain, and significantly more flexible than an ICP device. Existing $H_2/O_2$ torches are principally used for quartz glass blowing and by jewelers for melting platinum.

Several experiments were conducted by applying the $H_2/O_2$ torch to the edge of a wafer for varying lengths of time. It was found that organic material at the edge of a wafer could be removed in a manner very similar to that produced by the ICP. For at least some applications, a simple flame torch has been shown to produce a reactive stream of oxidizers that can be used to chemically modify surfaces, including such processes as cleaning, passivation, and/or activation.

Initially, a standard $H_2/O_2$ glass blowing torch 100 as shown in FIG. 1(a) was used to attempt to clean the surfaces with the flame 106. The torch 100 had two input tubes to receive process gasses, one tube 102 to receive the fuel for the flame, such as hydrogen, and a second tube 104 to receive the oxidizer, such as oxygen. These gases can be mixed in the torch itself. Many variations can exist in the shape and structure of the burner in such a torch, including whether the torch is a single-hole design or a multiple-hole design. Another variation includes a flash-back suppressor, usually located near the burner.

Figure 1B:
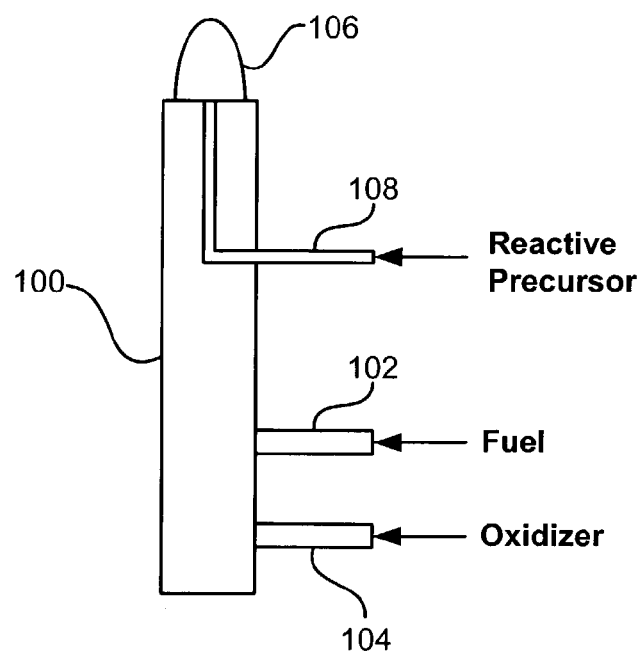

The torch 100 was then modified by adding a small tube 108 at the center of the burner orifice, as shown in FIG. 1(b). This modified $H_2/O_2$ torch 100 can first be ignited, then a reactive precursor such as $CF_4$ or $O_2$ can be allowed to flow out of the small center tube 108. The temperature at the center of the $H_2/O_2$ flame can be sufficient to fragment the $CF_4$ into reactive species, and possibly atomic radicals.

When the flame torch has a reactive precursor, such as $CF_4$, introduced in the middle of the flame, the core of reactive atoms in the flame can be used for etching as well as cleaning. As with other RAP techniques, a protective sheath is found on the outside of the reactive zone. Subsequent experiments have shown that it is possible to etch small pits into the surface of $SiO_2$ glass using such a torch. These pits, while smaller than pits etched using the ICP RAP process, have many of the same features. Whether the system cleans or etches depends upon the reactive species selected and the type of contaminant and/or surface present. It is possible for the same torch to clean then etch a surface simply by changing the reactive species injected into the flame.

Figure 4:
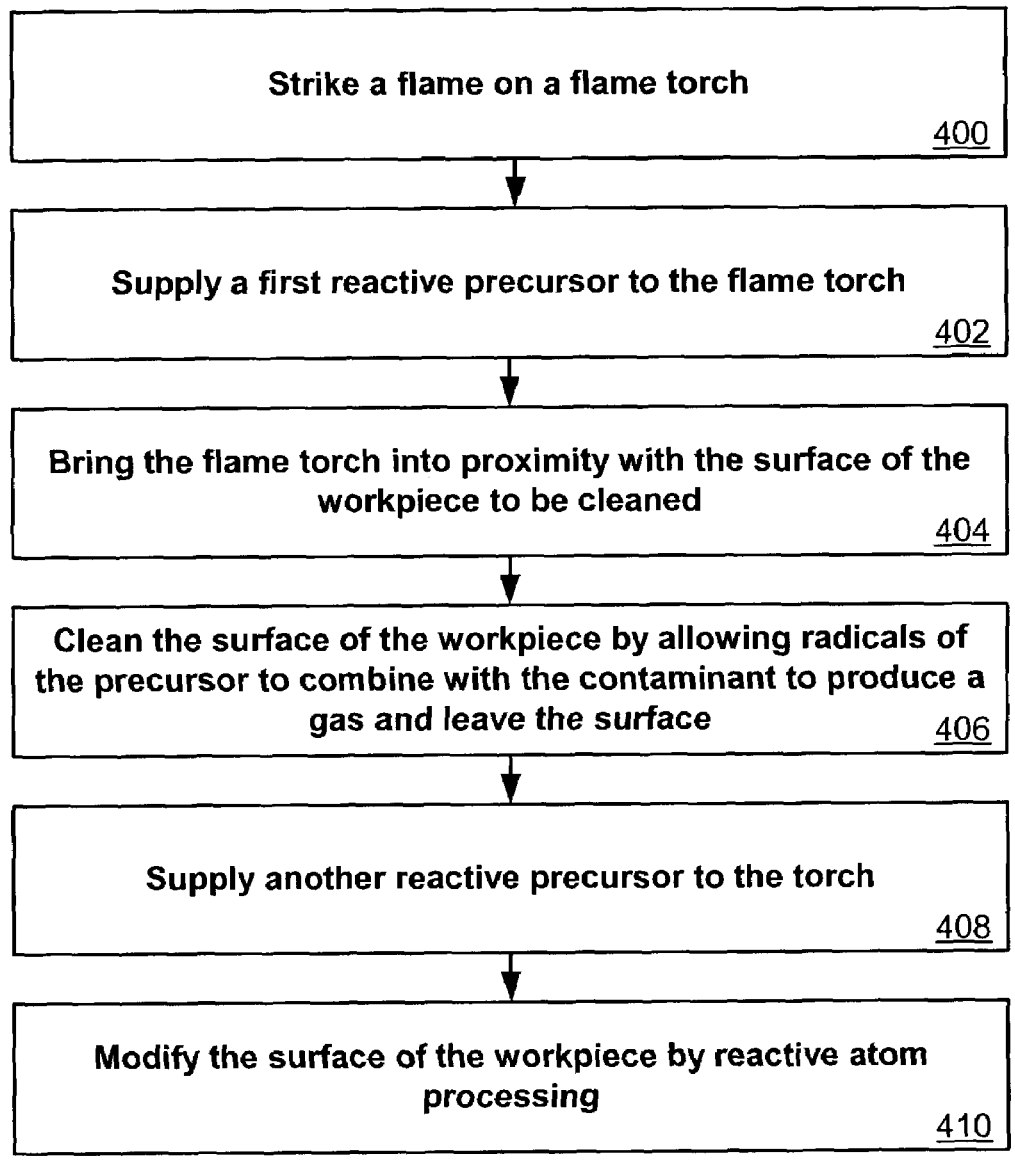
FIG. 4 is a flowchart showing a process that can be used with the system of FIGS. 1(a) and 1(b).

An example of this method is shown in FIG. 4. A flame is struck on a flame torch 400, such as a hydrogen-oxygen flame torch. A relative precursor is supplied to the flame 402. The flame torch is brought into proximity with the surface of the workpiece to be cleaned 404. The surface of the workpiece can then be cleaned by allowing radicals or fragments of the reactive precursor to combine with the contaminant on the surface to produce a gas and leave the surface 406. If the surface is to be modified after cleaning, an additional reactive precursor can be supplied to the flame 408. The surface of the workpiece can then be modified using reactive atom processing with the flame having the second reactive precursor 410.

A flame torch for use in cleaning a surface can be designed in several ways. In the relatively simple design of FIG. 1(a), a reactive precursor gas can be mixed with either the fuel or the oxidizer gas before being injected into the torch. Using this approach, a standard torch could be used to inject the precursor into the flame. Depending on the reactive precursor, the torch head might have to be made with specific materials. For example, mixing chlorine or chlorine-containing molecules into an $H_2/O_2$ torch can produce reactive chlorine radicals. The reactive chlorine radicals can lead to corrosion of common metals, such as brass or steel, that may make up the torch tip. Therefore, one would need to substitute the torch tip with a chemically inert metal or ceramic. It is also likely that only a specific range of gas mixtures will allow for stable combustion. There is a certain threshold up to which chlorine can be mixed with oxygen in an $H_2/O_2$ torch before the flame cannot support itself.

The slightly more complex design of FIG. 1(b) can introduce the reactive precursor gas into the $H_2/O_2$ flame using a small tube in the center of the torch orifice. THe flame in this case is usually chemically balanced and is neither a reducing nor oxidizing flame. In this design a variety of gases, liquids, or solids can be introduced coaxially into the flame to produce reactive components. The torch in this embodiment can produce, for example, O, Cl, and F radicals from solid, liquid, and gaseous precursors.

In any of the above cases, a stream of hot, reactive species can be produced that can chemically combine with the undesired "dirt" or "contaminants" on the surface of a part or workpiece. When the reactive atoms combine with the contaminants, a gas is produced that can leave the surface.

One key to the chemistry is to produce atomic radicals that react only with the material that needs to be removed, and that leave the underlying substrate unchanged. Other chemistries can be utilized that target certain materials present on the surface while leaving alone other materials on the surface. Another key consideration involves selecting a chemical reaction where the products are all gaseous, such that no residual "ash" is left on the surface of the part or workpiece.

In one example of a cleaning process using a system and method in accordance with the present invention, 200 mm wafers can be cleaned by first inspecting the wafers to determine the nature and location of the contamination. For example, under oblique illumination one contaminant can be seen as a thin band of blue on a backside edge of a wafer. Instead of scraping the contamination off through physical contact, the wafer can be mounted on a rotational stage and exposed to a flame torch with a precursor that is appropriate for that contaminant. The stage can be rotated at an appropriate rate, such as a rate between about 2 and about 200 rpm. The contaminated area of the wafer can be exposed to the flame until such time as the contamination is removed from the surface.

A RAP cleaning process has a number of advantages over standard plasma cleaning techniques. For example, unlike low-pressure RIE methods, the RAP system is directional. This allows a plasma stream to be directed onto a wafer edge, while leaving the rest of the wafer unexposed. A RAP system can function as a sub-aperture tool, making the system useful when specific areas need to be cleaned. The removal rate is also relatively high, such that large areas can be cleaned in a minimal amount of time.

A RAP system can operate over a wide range of pressures. Its most useful implementation is operation at or near atmospheric pressure, facilitating the treatment of large workpieces that cannot easily be placed in a vacuum chamber. The ability to work without a vacuum chamber also greatly increases throughput and reduces the cost of the tool that embodies the process.

The various chemistries that can be used with a RAP process can be tailored to remove a specific material while leaving other materials untouched. For example, the cleaning of solvent residue or fingerprint oils from optics and silicon wafers can be accomplished without any degradation of the polished surface. Tests have shown that any but the most careful cleaning with standard methods will leave small scratches in a surface. RAP cleaning techniques do not change the surface even at the atomic level. A flame system has been tested where the reactive oxygen species are created in an oxidizer-rich hydrogen/oxygen flame. The flame system can easily be used with a multi-nozzle burner or multi-head torch to quickly cover large areas of the surface. For other applications, a small flame can be produced that affects an area on the surface as small as about 0.2 mm full width-half maximum (FWHM) for a Gaussian- or nearly Gaussian-shaped tool. Another advantage of the flame system is that it does not require an expensive RF power generator not shielding from RF radiation. In fact, it can be a hand-held device, provided that adequate exhaust handing equipment and user safety devices are utilized.

Further, a flame torch used to clean surfaces is not limited to a $H_2$—$O_2$ flame torch. Any flame torch that is capable of accepting a source of reactive species, and fragmenting the reactive species into atomic radicals that can react with a contaminant on the surface, can be appropriate.

Other RAP Systems

Reactive atom plasma (RAP) systems and methods have advantages over other surface modification systems, such as PACE and chemical vapor machining, in that the number of potential products increases to include devices fabricated from heat sensitive components and heterogeneous materials that are typically difficult to polish by chemical means. Polishing and planarization are possible with little heat load and minimal material removal. The extension of such a process to cleaning of a surface further enhances the capabilities and scope of work for which RAP systems can be used.

Figure 2:
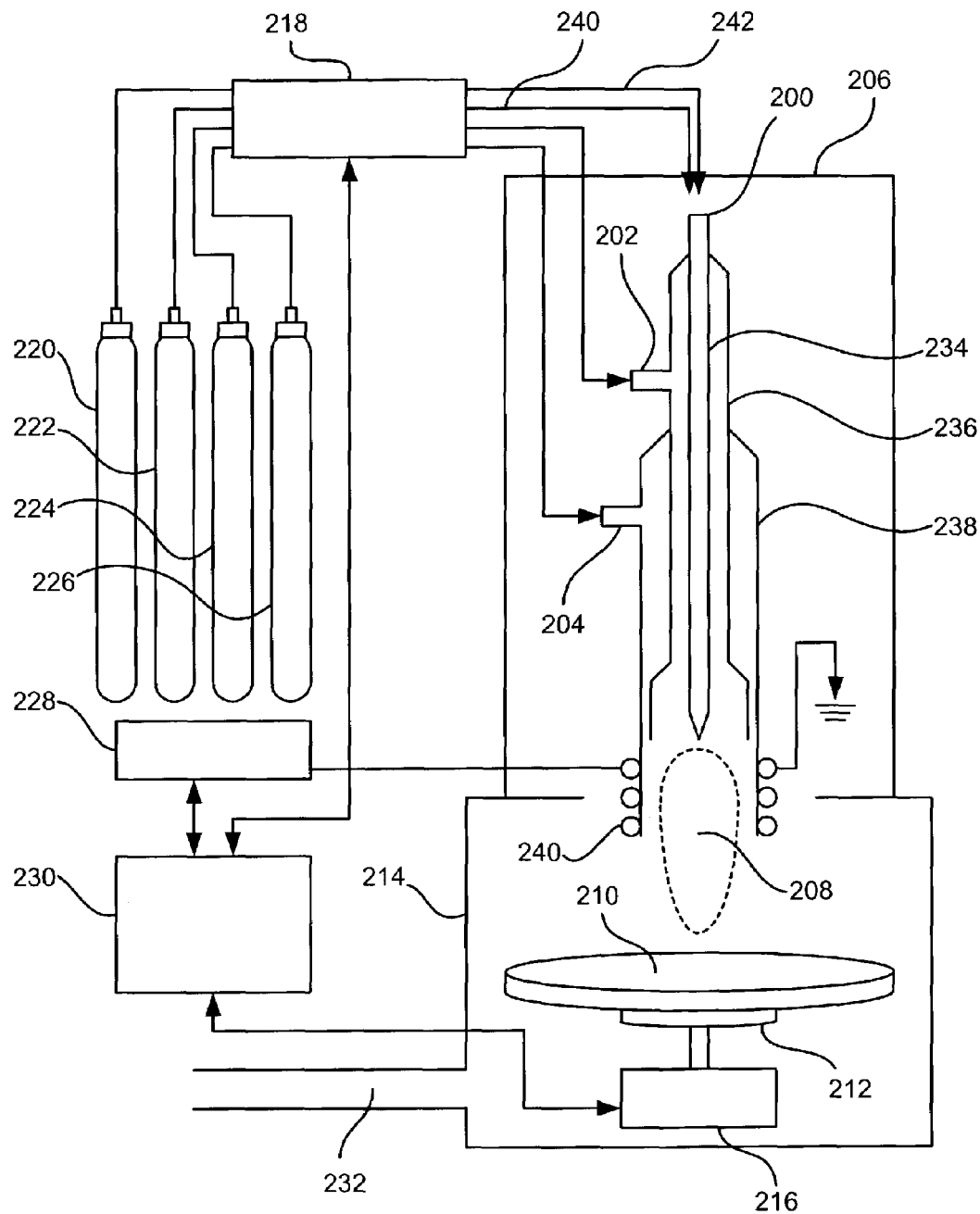
FIG. 2 is a diagram of an ICP torch system that can be used in accordance with another embodiment of the present invention.

Although the sue of a simple flame torch has many advantages over systems such as ICP torch systems, other RAP systems can be used to clean surfaces as well. Further, these systems can be used to clean and etch a workpiece using a single torch, without having to transfer the workpiece. FIG. 2 shows one embodiment of a reactive atom plasma (RAP) system that can be used in accordance with the present invention. FIG. 2 shows a plasma torch in a plasma box 206. The torch consists of an inner tube 234, an outer tube 238, and an intermediate tube 236. The inner tube 234 has a gas inlet 200 for receiving a stream of reactive precursors gas 242 from a mass flow controller 218. The torch can utilize different precursor gases during different processing steps. For instance, the torch might utilize a precursor adapted to clean a particular contaminant off a surface in a first step, while utilizing a precursor for redistributing material on the surface of the workpiece during a second step.

The intermediate tube 236 has a gas inlet 202 for receiving an auxiliary gas from the flow controller 218. The outer tube 238 has a gas inlet 204 for receiving plasma gas from the mass flow controller 218. The mass flow controller 218 can receive the necessary gases from a number of gas supplies 220, 222, 224, 226, and can control the amount and rate of gases passed to the respective tube of the torch. The torch assembly can generate and sustain plasma discharge 208, which can be used to clean then shape or polish a workpiece 210 located on a chuck 212 in the workpiece box 214. The workpiece box 214 has an exhaust 232 for carrying away any process gases or products resulting from, for example, the interaction of the plasma discharge 208 and the workpiece 210.

The chuck 212 in this embodiment is in communication with a translation stage 216, which is adapted to translate and/or rotate a workpiece 210 on the chuck 212 with respect to the plasma discharge 208. The translation stage 216 is in communication with a computer control system 230, such as may be programmed to provide the necessary information or control to the translation stage 216 to allow the workpiece 210 to be moved along a proper path to achieve a desired cleaning, shaping, and/or polishing of the workpiece. The computer control system 230 is in communication with an RF power supply 228, which supplies power to the torch. The computer control system 230 also provides the necessary information to the mass flow controller 218. An induction coil 240 surrounds the outer tube 238 of the torch near the plasma discharge 208. Current from the RF power supply 228 flows through the coil 240 around the end of the torch. This energy is coupled into the plasma.

Figure 3:
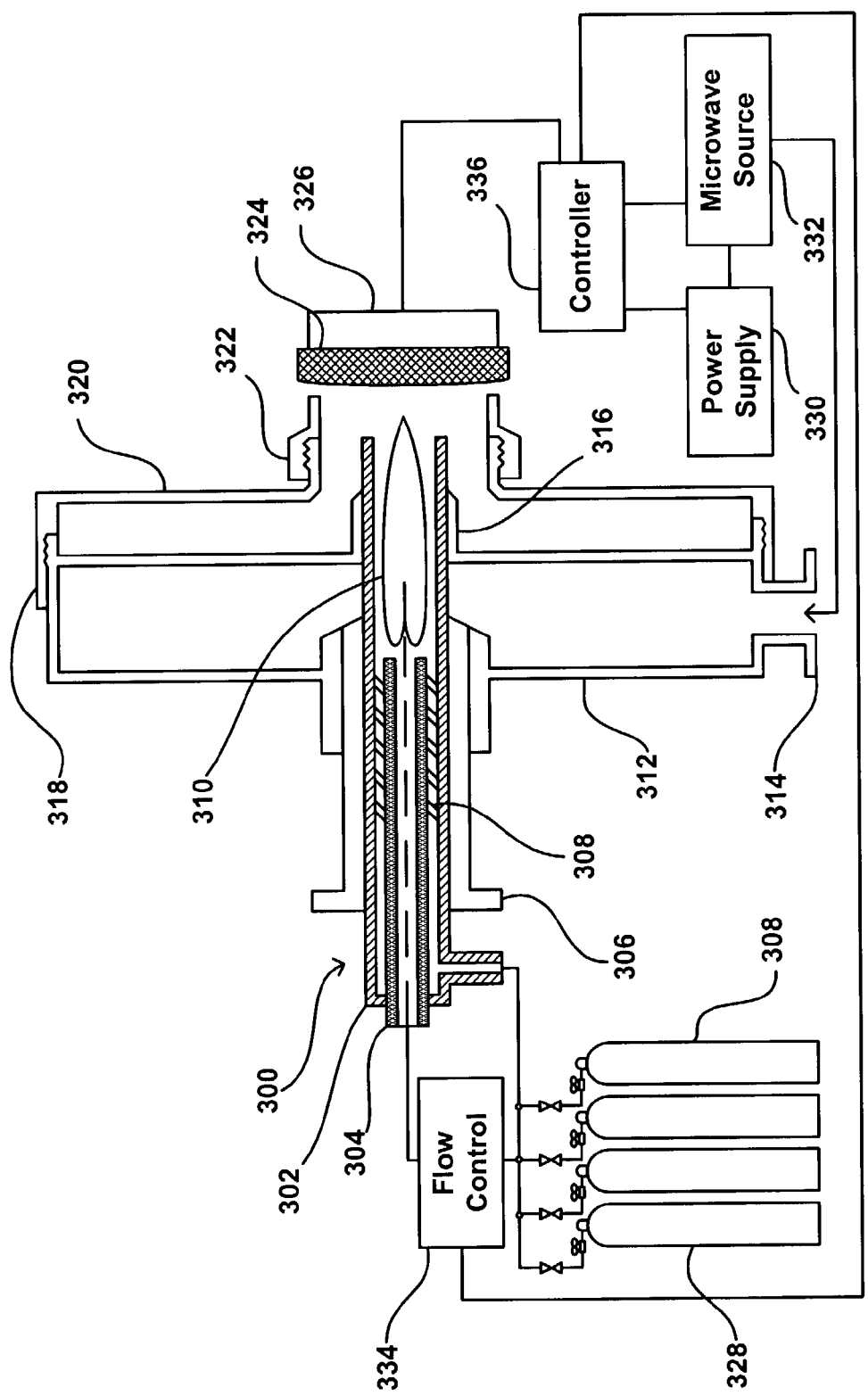
FIG. 3 is a diagram of an MIP torch system that can be used in accordance with another embodiment of the present invention.

As shown in FIG. 3, another RAP system that can be used in accordance with the present invention utilizes a microwave-induced plasma (MIP) source. An MIP source has proven to have a number of attributes that complement, or even surpass in some applications, the use of an ICP tool or a flame as an atomization source. The plasma can be contained in a quartz torch 300, which is distinguished from a standard ICP by the use of two concentric tubes instead of three. With a large enough bore, a torroidal plasma can be generated and the precursor injected into the center of the torch in a manner analogous to the ICP.

A helical insert 308 can be placed between the outer tube 302 and the inner tube 304 of the torch 300 to control tube concentricity, as well as to increase the tangential velocity of gas. The vortex flow tends to stabilize the system, and the high velocity aids in cooling the quartz tubes 302, 304.

The main portion of the microwave cavity 312 can be a circular or cylindrical chamber, machined from a highly conductive material, such as copper. The energy from a 2.45 GHz (or other appropriate) power supply 330 can be coupled into the cavity 312 through a connector 314 on one edge of the cavity. The cavity 312 can be tuned in one embodiment by moving a hollow cylindrical plunger 306, or tuning device, into or out of the cavity 312. The quartz torch 300 is contained in the center of the tuning device 306 but does not move while the system is being tuned.

An external gas sheath 320 can be used to shield the plasma 320 from the atmosphere. The sheath 320 confines and can contribute to the longevity of the reactive species in the plasma, and can keep the atmospheric recombination products as low as practically possible. In one embodiment, the end of the sheath 320 is approximately coplanar with the open end, or tip, of the torch 300. The sheath 320 can be extended beyond the tip of the torch 300 by installing an extension tube 322 using a threaded flange at the outlet of the sheath 320. The sheath itself can be threadably attached 318 to the main cavity 312, which can allow a fine adjustment on height to be made by screwing the sheath either toward or away from the cavity 312.

A supply of process gas 328 can provide process gas to both tubes 302, 304 of the torch 300. In one embodiment this process gas is primarily composed of argon or helium, but can also include carbon dioxide, oxygen or nitrogen, as well as other gases, if the chemistry of the situation permits. Gas flows in this embodiment can be between about one and about ten liters per minute. Again, the gases introduced to the torch can vary on the application. Reactive precursor gas(es) can be introduced to clean a surface, followed by a different precursor gas(es) to shape or otherwise modify the surface of the workpiece. This allows a workpiece to be cleaned and processed in a single chamber without a need to transfer the workpiece to different devices to accomplish each objective.

Chemistry

A reactive atom plasma process in accordance with embodiments of the present invention is based, at least in part, on the reactive chemistry of atomic radicals and reactive fragments formed by the interaction of a non-reactive precursor chemical with a plasma. In one such process, the atomic radicals formed by the decomposition of a non-reactive precursor interact with material on the surface of the part being cleaned or modified. The surface material is transformed to a gaseous reaction product and leaves the surface. A variety of materials can be processed using different chemical precursors and different plasma compositions. The products of the surface reaction in this process must be a gas under the conditions of the plasma exposure. If not, a surface reaction residue can build up on the surface which will impede further etching.

In the above examples, the reactive precursor chemical can be introduced as a gas. Such a reactive precursor could also be introduced to the plasma in either liquid or solid form. Liquids can be aspirated into the plasma and fine powders can be nebulized by mixing with a gas before introduction to the plasma. RAP processing can be used at atmospheric pressure. RAP can be used as a sub-aperture tool to precisely clean and shape surfaces.

A standard, commercially-available two- or three-tube torch can be used. The outer tube can handle the bulk of the plasma gas, while the inner tube can be used to inject the reactive precursor. Energy can be coupled into the discharge in an annular region inside the torch. As a result of this coupling zone and the ensuing temperature gradient, a simple way to introduce the reactive gas, or a material to be deposited, is through the center. The reactive gas can also be mixed directly with the plasma gas, although the quartz tube can erode under this configuration and the system loses the benefit of the inert outer gas sheath.

Injecting the reactive precursor into the center of the excitation zone has several important advantages over other techniques. Some atmospheric plasma jet systems, such as ADP, mix the precursor gas in with the plasma gas, creating a uniform plume of reactive species. This exposes the electrodes or plasma tubes to the reactive species, leading to erosion and contamination of the plasma. In some configurations of PACE, the reactive precursor is introduced around the edge of the excitation zone, which also leads to direct exposure of the electrodes and plasma contamination. In contrast, the reactive species in the RAP system are enveloped by a sheath of argon, which not only reduces the plasma torch erosion but also reduces interactions between the reactive species and the atmosphere.

The inner diameter of the outer tube can be used to control the size of the discharge. On a standard torch, this can be on the order of about 18 to about 24 mm. The size can be somewhat frequency-dependent, with larger sizes being required by lower frequencies. In an attempt to shrink such a system, torches of a two tube design can be constructed that have an inner diameter of, for example, about 14 mm. Smaller inner diameters may be used with microwave excitation, or higher frequency, sources.

The foregoing description of preferred embodiments of the present invention has been provided for the purposes of illustration and description. It is not intended to be exhaustive or to limit the invention to the precise forms disclosed. Many modifications and variations will be apparent to one of ordinary skill in the art. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

What is claimed is:

1. A method for cleaning a surface of a workpiece, comprising:
   supplying a reactive precursor to a torch;
   bringing the torch into proximity with the surface of the workpiece; and
   using a flame maintained by combustion inside the torch without an external energy source to clean the surface of the workpiece, the surface of the workpiece having a contaminant that chemically combines with a reactive species produced from the reactive precursor by the torch and leaves the surface of the workpiece.

2. A method according to claim 1, wherein:
   using the flame to clean the surface of a first contaminant while leaving a second contaminant, the surface of the workpiece having a first contaminant that chemically combines with the reactive species to produce a gas and leave the surface and a second contaminant that does not chemically combine with the reactive species.

3. A method according to claim 1, wherein:
   in the using step, the reactive species includes at least one atomic radical.

4. A method according to claim 1, further comprising:
supplying a source of fuel to the torch.

5. A method according to claim 1, further comprising:
supplying a source of oxidizer gas to the torch.

6. A method according to claim 1, further comprising:
striking the flame on the torch.

7. A method according to claim 1, further comprising:
striking the flame on the torch of a sufficient temperature to be capable of fragmenting the reactive precursor into the reactive species.

8. A method according to claim 1, further comprising:
altering the chemistry of the surface of the workpiece with the plasma.

9. A method according to claim 1, further comprising:
using reactive plasma processing to shape the surface of the workpiece.

10. A method according to claim 1, further comprising:
rotating the workpiece with respect to the torch.

11. A method according to claim 1, further comprising:
controlling the mass flow of the reactive precursor into the plasma.

12. A method according to claim 1, further comprising:
selecting a concentration of the reactive precursor to be introduced into the torch.

13. A method according to claim 1, further comprising:
introducing a process gas through an outer tube of the torch., 14. A method according to claim 1, further comprising:
coupling energy to a discharge region of the torch.

15. A method according to claim 1, further comprising:
controlling the size of a discharge by selecting the inner diameter of an outer tube of the torch.

16. A method according to claim 1, further comprising:
operating the torch at about atmospheric pressure.

17. A method according to claim 1, further comprising:
modifying the surface of the workpiece with the torch.

18. A method according to claim 1, further comprising:
polishing the surface of the workpiece with the torch.

19. A method according to claim 1, further comprising:
planarizing the surface of the workpiece with the flame.

20. A method according to claim 1, further comprising:
using a torch with multiple heads to increase the rate of cleaning.

21. A method for cleaning a surface of a workpiece, comprising:
supplying a reactive precursor to a flame maintained by combustion without using an external energy source; and
using the flame to clean the surface of the workpiece, the surface of the workpiece having a contaminant that chemically combines with a reactive species produced from the reactive precursor by the flame to leave the surface.

22. A method according to claim 21, wherein:
using the flame to clean the surface produces a gas when the contaminant chemically combines with the reactive species.

23. A method according to claim 21, further comprising:
bringing the flame into proximity with the surface of the workpiece.

24. A method according to claim 21, further comprising:
moving the flame relative to the surface of the workpiece.

25. A method for selectively cleaning a surface of a workpiece, the surface having more than one contaminant, comprising:
supplying a reactive precursor to a flame maintained by combustion without using an external energy source; and
using the flame to remove one of the contaminants from the surface of the workpiece, the contaminant to be removed capable of chemically combining with a reactive species produced from the reactive precursor by the flame to leave the surface.

26. A method according to claim 25, further comprising:
selecting the reactive precursor that will produce the reactive species that will chemically combine with one of the contaminants but not with any other contaminants.

27. A method for cleaning and modifying a surface of a workpiece, comprising:
supplying a first source of reactive precursor to a torch;
brining a flame maintained by combustion inside the torch without using an external energy source into proximity with the surface of the workpiece;
generating a first reactive species from the first source of reactive precursor via the flame;
using reactive atom plasma processing to clean the surface of the workpiece, the surface of the workpiece having a contaminant that chemically combines with the first reactive species to produce a gas and leave the surface;
supplying a second source of reactive species to the torch; and
generating a second reactive species from the second source of reactive precursor via the flame;
using reactive atom plasma processing to modify the surface of the workpiece, the surface of the workpiece capable of chemically reacting with the second reactive species.

28. A method according to claim 27, wherein:
using reactive atom plasma processing to modify the surface of the workpiece modifies the surface by a process selected from the group consisting of shaping, polishing, etching, planarizing, and redistributing.

29. A method for cleaning a surface of a workpiece, comprising:
supplying a reactive precursor to a torch;
supplying a fuel to the torch;
bringing the torch into proximity with the surface of the workpiece; and
using a flame maintained by combustion inside the torch without an external energy source to clean the surface of the workpiece, the surface of the workpiece having a contaminant that chemically combines with a reactive species produced from the reactive precursor by the torch and leaves the surface of the workpiece.

30. A method for cleaning a surface of a workpiece, comprising:
supplying a reactive precursor to a torch;
supplying an oxidizer gas to the torch;
brining the torch into proximity with the surface of the workpiece; and
using a flame maintained by combustion inside the torch without an external energy source to clean the surface of the workpiece, the surface of the workpiece having a contaminant that chemically combines with a reactive species produced from the reactive precursor by the torch and leaves the surface of the workpiece.

31. A method for modifying a surface of a workpiece, comprising:

supplying a reactive precursor to a torch;

bringing the torch into proximity with the surface of the workpiece; and using a flame maintained by combustion inside the torch without an external energy source to modify the surface of the workpiece, the surface of the workpiece having a contaminant that chemically combines with a reactive species produced from the reactive precursor by the torch and modifies the surface of the workpiece.

32. A method for cleaning a surface of a workpiece, comprising:

supplying a reactive precursor to a self-sustaining torch;

bringing the torch into proximity with the surface of the workpiece; and using a flame of the torch to clean the surface of the workpiece, the surface of the workpiece having a contaminant that chemically combines with a reaction species produced from the reactive precursor by the torch and leaves the surface of the workpiece.

33. The method according to claim 32, further comprising:

maintaining the flame from combustion inside the torch without using an external energy source.

* * * * *

UNITED STATES PATENT AND TRADEMARK OFFICE
CERTIFICATE OF CORRECTION

PATENT NO. : 7,371,992 B2  Page 1 of 1
APPLICATION NO. : 10/384506
DATED : May 13, 2008
INVENTOR(S) : Jeffrey W. Carr It is certified that error appears in the above-identified patent and that said Letters Patent is hereby corrected as shown below:

In the claims:

Column 9, line 27: After "torch." delete comma

Signed and Sealed this

Fifth Day of August, 2008

JON W. DUDAS
*Director of the United States Patent and Trademark Office*